(12) United States Patent
Bhutta

(10) Patent No.: US 9,591,739 B2
(45) Date of Patent: Mar. 7, 2017

(54) MULTI-STAGE HETERODYNE CONTROL CIRCUIT

(71) Applicant: Reno Technologies, Inc., Wilmington, DE (US)

(72) Inventor: Imran Ahmed Bhutta, Moorestown, NJ (US)

(73) Assignee: Reno Technologies, Inc.

(\*) Notice: Subject to any disclaimer, the term of this patent is extended or adjusted under 35 U.S.C. 154(b) by 109 days.

(21) Appl. No.: 14/702,863

(22) Filed: May 4, 2015

(65) Prior Publication Data

US 2015/0319838 A1 Nov. 5, 2015

Related U.S. Application Data

(60) Provisional application No. 61/987,721, filed on May 2, 2014.

(51) Int. Cl.
| | |
|---|---|
| *H01J 7/24* | (2006.01) |
| *H05H 1/46* | (2006.01) |
| *H04B 10/00* | (2013.01) |
| *H01J 37/32* | (2006.01) |

(52) U.S. Cl.
CPC ......... *H05H 1/46* (2013.01); *H01J 37/32174* (2013.01); *H01J 37/32183* (2013.01); *H04B 10/142* (2013.01); *H05H 2001/4645* (2013.01); *H05H 2001/4682* (2013.01)

(58) Field of Classification Search
CPC ..... H05H 1/46; H05H 2001/4645; H01J 7/24; H05B 31/26; G01R 23/16; G06F 3/041

USPC ............... 315/111.01–111.91, 39; 118/712
See application file for complete search history.

(56) References Cited

U.S. PATENT DOCUMENTS

| | | | |
|---|---|---|---|
| 6,791,274 | B1 | 9/2004 | Hauer et al. |
| 6,958,630 | B2 | 10/2005 | Watanabe et al. |
| RE42,917 | E | 11/2011 | Hauer et al. |
| 8,076,247 | B2 | 12/2011 | Collins et al. |
| 8,643,281 | B2 | 2/2014 | York et al. |
| 8,647,585 | B2 | 2/2014 | Hancock |
| 2008/0128087 | A1 | 6/2008 | Hayano et al. |
| 2010/0247403 | A1* | 9/2010 | Hancock ................ A61L 2/14 422/186.29 |

FOREIGN PATENT DOCUMENTS

DE     10116886     8/2007

\* cited by examiner

*Primary Examiner* — Jimmy Vu
(74) *Attorney, Agent, or Firm* — The Belles Group, P.C.

(57) ABSTRACT

A circuit for controlling an RF generator, the circuit including first and second heterodyne stages. The first heterodyne stage receives an input signal, which is based on a characteristic of an RF signal generated by the RF generator, and is configured to: mix the input signal with a first mix signal to generate a first heterodyne signal and to filter the first heterodyne signal through a low pass filter. The second heterodyne stage receives the filtered first heterodyne signal and is configured to: mix the filtered first heterodyne signal with a second mix signal to generate a second heterodyne signal and to filter the second heterodyne signal through a band pass filter. A detection stage converts the filtered second heterodyne signal to a DC signal, and a power control stage receives the DC signal and controls the RF signal in response to the DC signal.

38 Claims, 5 Drawing Sheets

MULTI-STAGE HETERODYNE CONTROL CIRCUIT

CROSS REFERENCE TO RELATED APPLICATIONS

Priority is claimed to U.S. Provisional Patent Application Ser. No. 61/987,721, filed May 2, 2014, the disclosure of which is incorporated herein by reference in its entirety.

FIELD OF THE INVENTION

The field of the present invention relates to heterodyne control circuits, particularly for multi-stage heterodyne control circuits that provide feedback control for RF signals.

BACKGROUND OF THE INVENTION

Single stage down converting heterodyne circuits are sometimes used in applications, where it is desirable to remove the effect of unwanted frequencies. For example, in modern semiconductor fabrication processes that utilize plasma chambers for processing wafers, outputs from multiple RF generators, operating at different frequencies, are injected into a single plasma chamber. In this environment, the mixed frequencies need to be separated in the power detection circuitry of each RF generator so that the power output from each RF generator may be controlled based solely upon characteristics at the operational frequency of the respective RF generator, and not upon characteristics at the operational frequency of any other RF generator. A heterodyne control circuit may be used to achieve this goal.

In the prior art of semiconductor fabrication processes that employ multiple RF generators to inject power into a plasma chamber, a heterodyne circuit is often used to separate the operational frequencies. Signals at the output of each RF generator are sensed by an output sensor, filtered through a heterodyne circuit to isolate the desired signal, which is then provided to the power detection circuit, the output of which is used for feedback control of the respective RF generator. The signals sensed by the output sensor, for each RF generator contain each of the signals injected into the plasma chamber, along with mixed signals and noise signals, and these sensed signals may be any characteristic of the power signals injected into the plasma chamber, such as voltage, current, or power.

By way of a specific example, in the case of a single plasma chamber that is injected with power from two RF generators, the first RF generator operating at 60 MHz, and the second RF generator operating at 2 MHz, the resulting mix of frequencies produced by this system may include signals at 60 MHz, 2 MHz, 58 MHz, and 62 MHz, with the latter two frequencies being byproducts of mixing the first two frequencies within the plasma chamber. The output sensor for each of the first and second RF generators will sense signals at 60 MHz, 2 MHz, 58 MHz, 62 MHz, along with any signals resulting from noise. The heterodyne circuit down converts the sensed signals and enables the 60 MHz signal to be more easily separated from the 58 MHz and 62 MHz signals. Without the heterodyne circuit, separation of the close frequencies would be otherwise difficult. The heterodyne circuit may down convert the 60 MHz signal by mixing with an oscillator signal having a frequency that is offset from the 60 MHz signal by a predetermined amount, such as less than 1000 kHz. The resulting mixed signal is a function of the detected 60 MHz signal, and with proper filtering, the mixed signal can be used to perform power detection without being negatively impacted by the 58 MHz and 62 MHz signals.

The power detection circuit receives the mixed and filtered signal from the heterodyne circuit. Typical power detection circuits for an RF signal generally employ a peak detector, and the typical peak detector includes one or more hold capacitors that are charged by the input RF signal. The hold voltage from the one or more hold capacitors is then converted into a DC signal, and the DC signal is used by the control circuitry to determine the output of the RF generator and to thereby control the RF generator.

In some plasma applications, it is desirable to pulse the output power of one or more of the RF generators at a predetermined frequency in the MHz range. When the power during each pulse needs to be accurately monitored, the typical heterodyne and detecting circuits fall short. This is because the typical hold capacitor for a signal having a frequency of 1000 kHz or less is incapable of charging fast enough to measure the peak value of pulses in the MHz range, so that the measurement of power detection accuracy deteriorates. Under this circumstance, the peak value of the detected signal becomes dependent upon the peak voltage of the hold capacitor, which in turn can vary with the tolerance of the hold capacitor. This can result in the peak value of the detected signal varying by 7%-8%. Such a variance in the error signal results in errors in controlling the output of the RF generator, which then directly affects the processes performed within the plasma chamber. Therefore, a new method for processing and detecting RF signals for purposes of providing feedback to an RF generator is desirable.

SUMMARY OF THE INVENTION

The present invention is directed toward a multi-stage heterodyne control circuit. An RF generator may be advantageously controlled by such a multi-stage heterodyne control circuit, particularly an RF generator that is one of several providing power input into a plasma chamber.

In a first separate aspect of the present invention, a circuit for controlling an RF generator includes: a first heterodyne stage receiving an input signal, the input signal being based on a characteristic of an RF signal generated by the RF generator, with the first heterodyne stage configured to: mix the input signal with a first mix signal to generate a first heterodyne signal; and filter the first heterodyne signal through a low pass filter; a second heterodyne stage receiving the filtered first heterodyne signal, the second heterodyne stage configured to: mix the filtered first heterodyne signal with a second mix signal to generate a second heterodyne signal; and filter the second heterodyne signal through a band pass filter; a detection stage configured to convert the filtered second heterodyne signal to a DC signal; and a power control stage receiving the DC signal and configured to control the RF signal in response to the DC signal.

In a second separate aspect of the present invention, a method for controlling an RF generator includes: sensing a characteristic of an RF signal output from the RF generator and outputting a sensor signal in response to the sensed characteristic; mixing the sensor signal with a first mix signal to generate a first heterodyne signal; filtering the first heterodyne signal through a low pass filter; mixing the filtered first heterodyne signal with a second mix signal to generate a second heterodyne signal; filtering the second heterodyne signal through a band pass filter; detecting the filtered second heterodyne signal to generate a DC signal; and controlling the RF signal in response to the DC signal.

In a third separate aspect of the present invention, an RF generator includes: an RF generator configured to generate an RF signal; a signal sensor configured to sense a characteristic of the RF signal and output a sensor signal in response thereto; and a control circuit operationally coupled to the RF generator, the control circuit including: a first heterodyne stage receiving the sensor signal, with the first heterodyne stage configured to: mix the sensor signal with a first mix signal to generate a first heterodyne signal; and filter the first heterodyne signal through a low pass filter; a second heterodyne stage receiving the filtered first heterodyne signal, the second heterodyne stage configured to: mix the filtered first heterodyne signal with a second mix signal to generate a second heterodyne signal; and filter the second heterodyne signal through a band pass filter; and a detection stage configured to convert the filtered second heterodyne signal to a DC signal; wherein the control circuit is configured to control the RF signal in response to the DC signal.

In a fourth separate aspect of the present invention, a semiconductor fabrication system includes: an RF generator configured to generate an RF signal; a plasma chamber operationally coupled to the RF generator to receive the RF signal; a signal sensor operationally coupled between the RF generator and the plasma chamber, the signal sensor configured to sense a characteristic of the RF signal and output a sensor signal in response thereto; and a control circuit operationally coupled to the RF generator and to the signal sensor, the control circuit including: a first heterodyne stage receiving the sensor signal, with the first heterodyne stage configured to: mix the sensor signal with a first mix signal to generate a first heterodyne signal; and filter the first heterodyne signal through a low pass filter; a second heterodyne stage receiving the filtered first heterodyne signal, the second heterodyne stage configured to: mix the filtered first heterodyne signal with a second mix signal to generate a second heterodyne signal; and filter the second heterodyne signal through a band pass filter; and a detection stage configured to convert the filtered second heterodyne signal to a DC signal; wherein the control circuit is configured to control the RF signal in response to the DC signal.

In a fifth separate aspect of the present invention, a control circuit includes: a first heterodyne stage receiving an input signal, the input signal being based on a characteristic of a pulsed RF signal, with the first heterodyne stage configured to: mix the input signal with a first mix signal to generate a first heterodyne signal; and filter the first heterodyne signal through a low pass filter; a second heterodyne stage receiving the filtered first heterodyne signal, the second heterodyne stage configured to: mix the filtered first heterodyne signal with a second mix signal to generate a second heterodyne signal; and filter the second heterodyne signal through a band pass filter; a detection stage configured to convert the filtered second heterodyne signal to a DC signal; and a power control stage receiving the DC signal and configured to control the pulsed RF signal in response to the DC signal.

Accordingly, an improved multi-stage heterodyne control circuit is disclosed. Advantages of the improvements will be apparent from the drawings and the description of the preferred embodiment.

BRIEF DESCRIPTION OF THE DRAWINGS

The foregoing summary, as well as the following detailed description of the exemplary embodiments, will be better understood when read in conjunction with the appended drawings. It should be understood, however, that the invention is not limited to the precise arrangements and instrumentalities shown in the following figures.

DETAILED DESCRIPTION OF THE INVENTION

The description of illustrative embodiments according to principles of the present invention is intended to be read in connection with the accompanying drawings, which are to be considered part of the entire written description. In the description of embodiments of the invention disclosed herein, where circuits are shown and described, one of skill in the art will recognize that for the sake of clarity, not all desirable or useful peripheral circuits and/or components are shown in the figures or described in the description. Moreover, the features and benefits of the invention are illustrated by reference to the disclosed embodiments. Accordingly, the invention expressly should not be limited to such disclosed embodiments illustrating some possible non-limiting combinations of features that may exist alone or in other combinations of features; the scope of the invention being defined by the claims appended hereto.

As used throughout, ranges are used as shorthand for describing each and every value that is within the range. Any value within the range can be selected as the terminus of the range. In addition, all references cited herein are hereby incorporated by reference in their entireties. In the event of a conflict in a definition in the present disclosure and that of a cited reference, the present disclosure controls.

Figure 1:
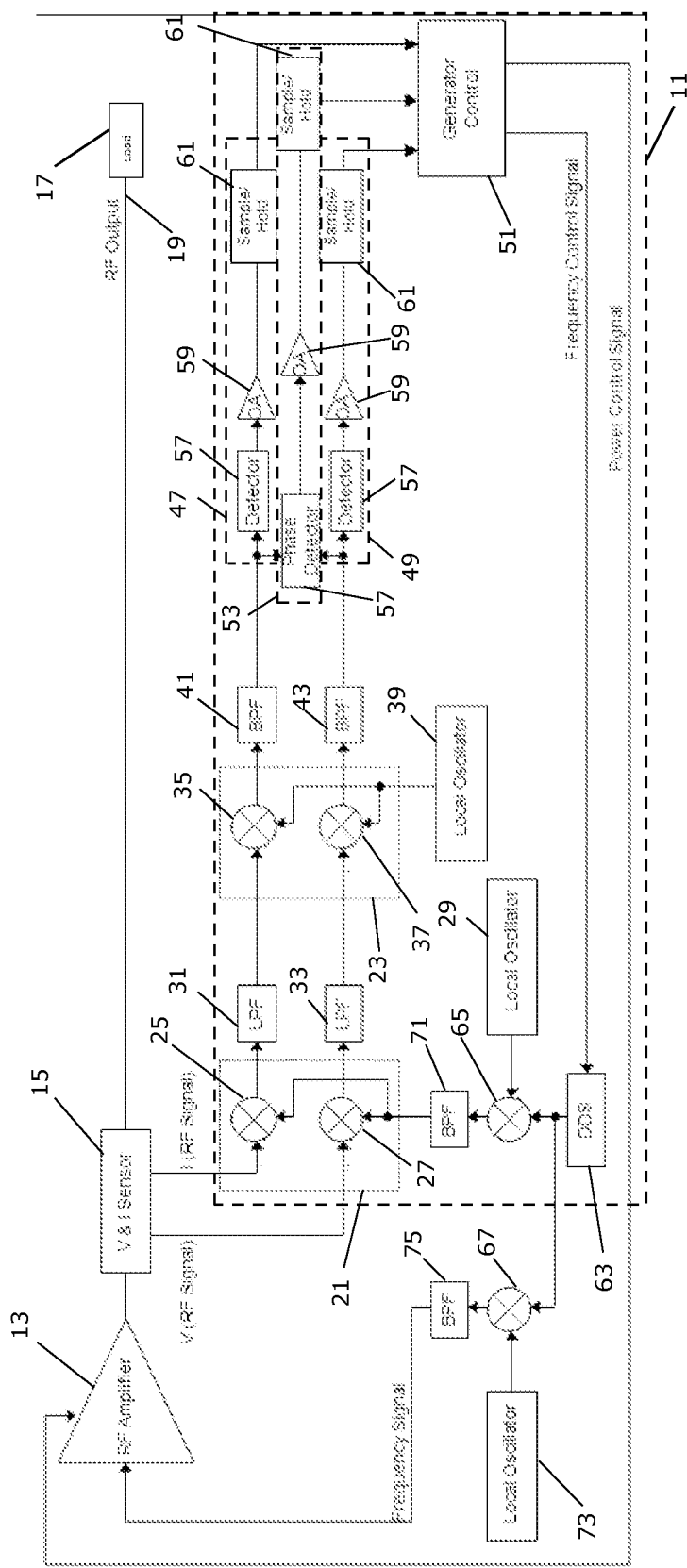
FIG. 1 is a schematic diagram showing a control circuit with two heterodyne stages coupled to an RF generator.

Turning in detail to the drawings, FIG. 1 illustrates a control circuit 11 coupled to an RF amplifier 13 and to an RF signal sensor 15. The RF amplifier 13 generates an RF output signal at a designated operational frequency, and this RF output signal passes through the RF signal sensor 15 and is injected into a load 17 at the RF output 19. In the embodiment shown, the RF output signal generated by the RF amplifier 13 is pulsed. In certain embodiments, the RF output signal may not be pulsed. In certain other embodiments, more than one RF output signal, each from one of a plurality of RF amplifiers, may be injected into the load. In such embodiments, any one or more of the RF output signals generated by the RF amplifiers may be pulsed, and the pulsing of any of the RF amplifiers may be activated and deactivated when pulsing is needed or not needed for the application.

The RF signal sensor 15 senses, in the embodiment shown, two different characteristics of a sensed RF signal returned from the load, where this sensed RF signal may be a combination of one or more RF output signals from, respectively, one or more RF amplifiers after such one or more RF output signals have been injected into the load 17, a reflection of one or more RF output signals from the load 17 resulting from impedance mismatch, and RF noise signals that result from the functionality (e.g., a semiconductor fabrication process) of the load 17. The sensed RF signal, therefore, includes frequency components from the various RF sources. The RF signal sensor 15 is configured to sense both a voltage characteristic of the sensed RF signal and a current characteristic of the sensed RF signal. Both of these sensed characteristics include all frequency components from the various RF sources. As output, the RF signal sensor 15 generates a voltage-component input signal and a current-component input signal. Each of the voltage-component input signal and the current-component input signal reflect, respectively, the voltage and current of the sensed RF signal, and each includes all frequency components from the various RF sources. Through appropriate processing, the operating voltage and current of the RF generator 13 may be determined, even when the RF generator 13 is operating in a pulsed mode.

The control circuit 11 includes two heterodyne stages 21, 23, with the first heterodyne stage 21 receiving two separate input signals from the RF signal sensor 15, one being a voltage-component input signal and the other being a current-component input signal. In alternative embodiments, other types of input signals may be generated by the RF signal sensor 15. In still other alternative embodiments, a directional coupler may be substituted for the RF signal sensor 15, with the directional coupler functioning as described in U.S. Pat. No. 6,791,274, such that the directional coupler generating the input signals for the first heterodyne stage 21. In yet other alternative embodiments, a phase/magnitude detector may be substituted for the RF signal sensor 15.

The voltage-component input signal is received into a first mixer 25 of the first heterodyne stage 21, and the current-component input signal is received into a second mixer 27 of the first heterodyne stage 21. Each mixer 25, 27 also receives as input a first mix signal from a first local oscillator 29, and from the combined respective inputs, each mixer 25, 27 generates a first heterodyne signal, each of which is received at one of two low pass filters 31, 33. The filtered first heterodyne signals from the low pass filters 31, 33 are received at the second heterodyne stage 23, which includes a first mixer 35 and a second mixer 37. One of the filtered first heterodyne signals is received into the first mixer 35, and the other of the filtered first heterodyne signals is received into the first mixer 37. Each mixer 35, 37 also receives as input a second mix signal from a second local oscillator 39, and from the combined respective inputs, each mixer 35, 37 generates a second heterodyne signal, each of which is received at one of two band pass filters 41, 43. Each of the filtered second heterodyne signals from the respective band pass filters 41, 43 are received by detector stages 47, 49, each of which is configured to generate a DC signal based upon one of the filtered second heterodyne signals, with the DC signal being received by a power control stage 51. Each of the filtered second heterodyne signals from the respective band pass filters 41, 43 are also received in a third detector stage 53, which is configured to process the two filtered second heterodyne signals, to determine a relative phase and between the two filtered second heterodyne signals, and to generate a third DC signal that is also received by the power control stage 51. As shown, the DC signal generated by the first detector stage 47 is representative of the current of the RF signal sensed by the RF signal sensor 15, the DC signal generated by the second detector stage 49 is representative of the voltage of the RF signal sensed by the RF signal sensor 15, and the DC signal generated by the third detector stage 53 is representative of the relative phase between the voltage and the current in the RF signal sensed by the RF signal sensor 15.

Each detector stage 47, 49, 53 operates in a manner known to those of skill in the art and includes a detector circuit 57, each of which is configured to detect one of a voltage, a current, and a phase of the input signal(s), an op amp 59 to amplify the output of the detector circuit 57, and a hold capacitor 61 to convert the output of the op amp 59 to a DC signal. Additional or fewer components may be included as part of each detector stage 47, 49, 53, as appropriate for a particular implementation.

In response to the received DC signals, the power control stage 51 controls the power output and operational frequency of the RF amplifier 13 through, respectively, a power control signal and a frequency control signal. The power control stage 51 may be a programmable processor programmed to performing the control functions of determining the power control signal and the frequency control signal in response to the received DC signals. The power control signal is received by the RF amplifier 13 and is used to control the power output of the RF amplifier 13. The frequency control signal is received by a direct digital synthesizer 63 which generates a fixed frequency that is output to two mixers 65, 67. The first mixer 65 mixes the fixed frequency with a first base frequency from a local oscillator 69, and the output of the first mixer 65 is passed through a band pass filter 71 to generate a frequency signal that drives the RF amplifier 13. The second mixer 67 mixes the fixed frequency with a second base frequency from another local oscillator 73, and the output of the second mixer is passed through a band pass filter 75 to generate the first mix signal. The first base frequency and the second base frequency differ by a predetermined frequency offset, which, in certain embodiments, is up to several hundred kHz different from the first base frequency.

During operation, the first heterodyne stage 21 may be used to down-convert the input signals to a frequency range in which the noise and other frequencies present, such as those from other RF generators, are more easily filtered out by the low pass filters 31, 33. The second heterodyne stage 23 may be used to up-convert the filtered first heterodyne signal to a frequency range in which the detector stages 47, 49, 53 are better responsive to pulsed operation modes of the RF amplifier 13. Although the pulsed operation mode of the RF amplifier 13 may not be used constantly, for systems in which a pulsed operation mode is at least occasionally used, the control circuit 11 provides for more accurate control of the output of the RF amplifier.

In certain embodiments, the first heterodyne stage 21 down-converts the input signals to a frequency that is at least one order of magnitude less than the frequency of the input signals, and the second heterodyne stage 23 then up-converts the filtered first heterodyne signal to a frequency that is at least one order of magnitude higher than the frequency of the filtered first heterodyne signal.

By way of example, the frequency signal that drives the RF amplifier 13 may be at 60 MHz, and the first mix signal may be at 60.9 MHz, such that the resulting filtered first heterodyne signal may have a frequency of 900 kHz. As is known in the art, the filtering of the first heterodyne signal is better able to separate the first heterodyne signal from all other frequencies present in the signal being processed, as compared to if the filtering was attempted without the down-conversion. Furthering the example, the second mix signal may be at 80 MHz, such that the resulting filtered second heterodyne signal may have a frequency of 80.9

MHz. At this frequency, the detector stages 47, 49, 53 are better able to generate the respective DC signals when the RF amplifier 13 is pulsed. At higher frequencies, such as frequencies in the 50-100 MHz range, the hold capacitors 61 in the detector stages 47, 49, 53 will generally have lower capacitance values, so that they have a shorter charge time, and with the hold capacitors 61 having a shorter charge, the detector stages 47, 49, 53 are able to more accurately detect the power of the filtered second heterodyne signal. The increased accuracy occurs because hold capacitors 61 with smaller capacitance values are able to reach a steady state value in a time frame that is commensurate with the pulse frequency of the signal, particularly when the pulse frequency is in the MHz range.

Figure 2:
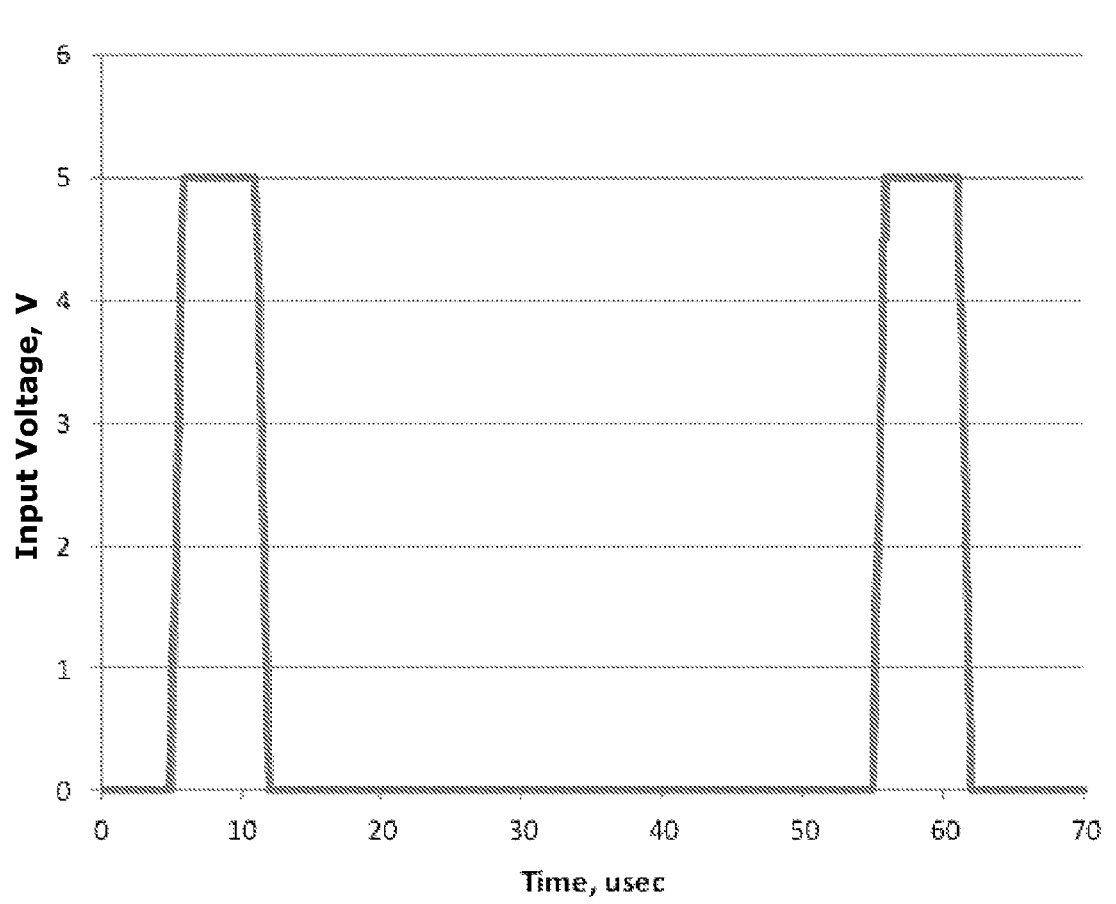
FIG. 2 is a chart showing a pulsed RF input voltage envelope for the control circuit of FIG. 1.
Figure 3:
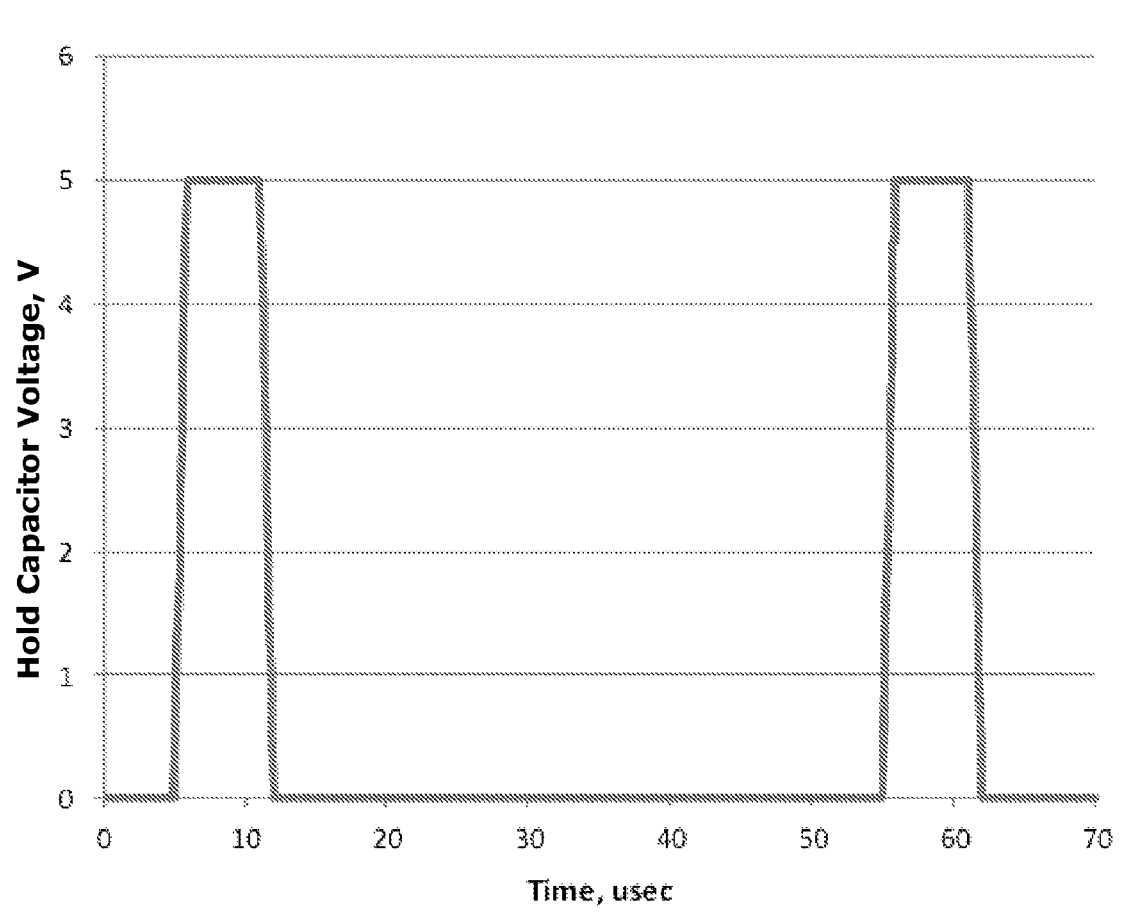
FIG. 3 is a chart showing a hold capacitor voltage for the control circuit of FIG. 1.
Figure 4:
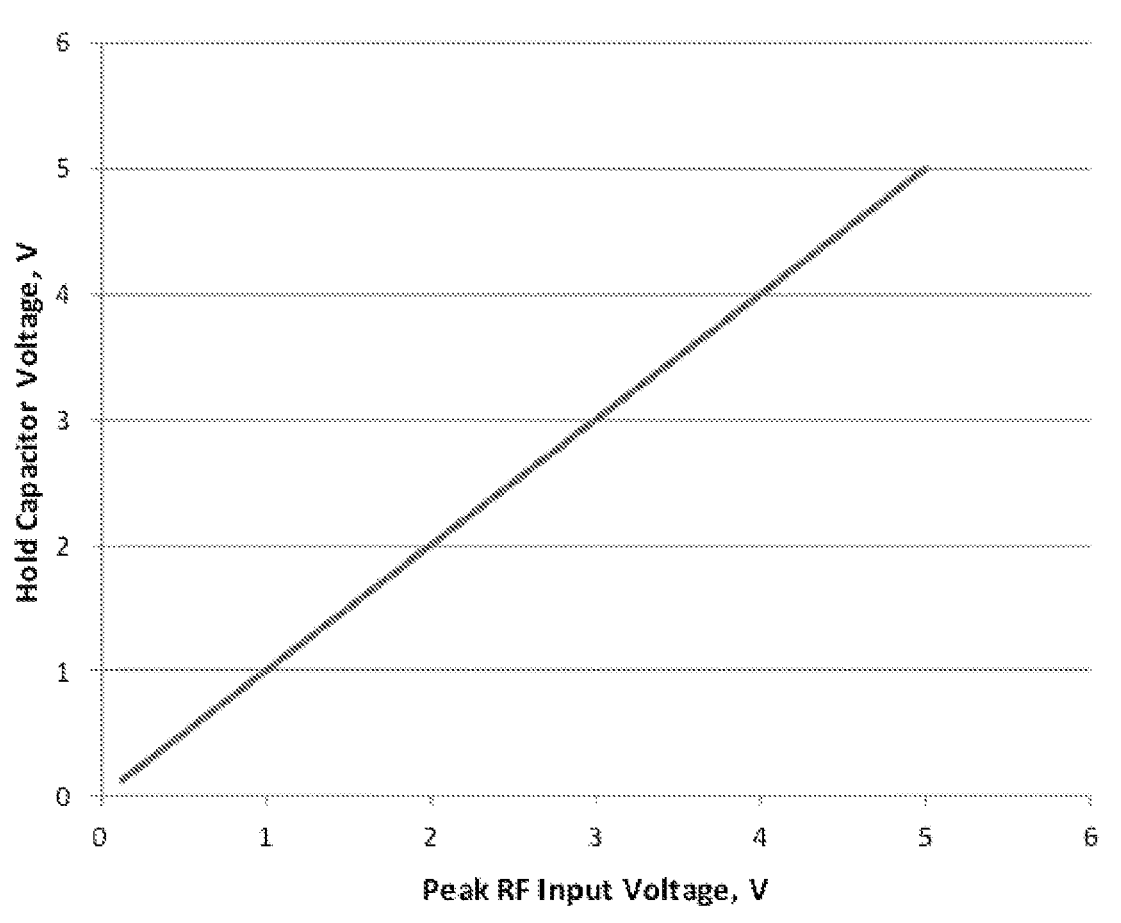
FIG. 4 is a chart showing the relationship between a peak RF input voltage and a hold capacitor voltage for the control circuit of FIG. 1, taking into account the hold capacitor component tolerance.

Still furthering the example, the RF amplifier 13 driven by the frequency signal at 60 MHz may be pulsed at 20 MHz on a 20% duty cycle, which would result in the filtered second heterodyne signal being at 80.9 MHz, pulsed at 20 MHz on a 20% duty cycle, and for such a filtered second heterodyne signal, the hold capacitor may have a capacitance value of about 430 pF. FIG. 2 is a graph showing the RF envelope of the 80.9 MHz signal pulsed at 20 Mhz on a 20% duty cycle. FIG. 3 shows the voltage of one of the hold capacitors receiving the filtered second heterodyne signal that is generated from a pulsed RF signal, and a comparison of the charts of FIGS. 2 and 3 shows that the hold capacitor voltage is substantially the same as the RF envelope of the filtered second heterodyne signal. Moreover, even when the effect of a capacitance tolerance within the hold capacitors 61 is taken into account, such as, for example, a 1% component tolerance, the voltage of the hold capacitors 61 is expected to provide an accurate measurement of the peak voltage of the RF envelope without adversely being affected by the component tolerance, as is shown in FIG. 4.

By comparison, a control circuit which includes a single heterodyne stage for down-converting the RF input signal to a frequency range in which other frequencies present in the signal may be easily filtered out will see a reduction in accuracy when the RF generator is operated in a pulsed mode. By way of specific example, if a pulsed RF input signal having a frequency of 60 MHz, and a pulse of 20 MHz on a 20% duty cycle, is down-converted to 900 kHz, then the typical hold capacitor used in the detector stage may have a capacitance value of about 39,000 pF to detect the peak value of the filtered from the single heterodyne stage. The effect of a 39,000 pF hold capacitor is to reduce the slew rate of the detector stage to approximately 0.5 V/µsec, the slew rate being a measure of how fast the output voltage of the detector stage changes when the voltage at the input of the detector stage is changed. Since the typical pulse rise time of a 20 MHz pulsed RF signal is of the order of 1 µsec or less, the output of the detector stage of the prior art can only change by 0.5V in the time the pulse rises to full power. As a result, by the time the pulse moves past the peak, the hold capacitor has not charged to its peak value, and power detection accuracy necessarily deteriorates. Moreover, since the hold capacitor is not able to reach its peak value during the timeframe the pulse of the signal is at its peak, the measurement of the detector stage becomes dependent upon the peak voltage of the hold capacitor, which can vary with the tolerance of the hold capacitor. For a typical 39,000 pF capacitor, the tolerance is at best +/−10%, which means that the peak voltage of the hold capacitor varies by between about 7%-8%. Thus, a control circuit which includes a single heterodyne stage has limitations when used in high speed pulsing applications and does not allow for accurate power detection when the RF signal being processed is pulsed.

The control circuit with a dual stage heterodyne therefore enables a faster slew rate response from the detector stages of the control circuit, and it provides a considerably more accurate measurement of pulsed input signals.

Figure 5:
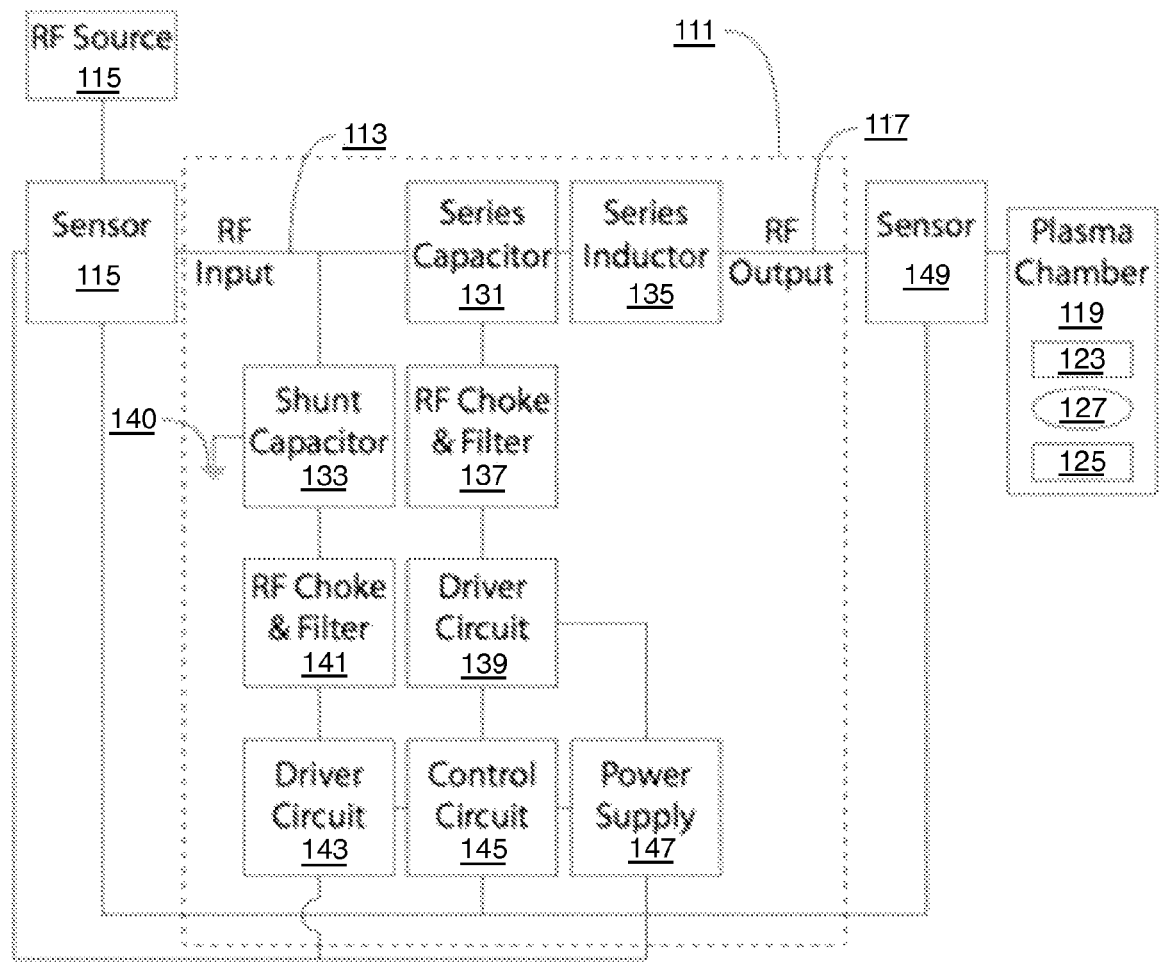
FIG. 5 is a schematic diagram showing the control circuit of FIG. 1 incorporated into a semiconductor wafer fabrication system.

A system 110 for semiconductor wafer fabrication is shown in FIG. 5. The system 110 includes an RF impedance matching network 111 coupled to an RF generator 115 and to a plasma chamber 119. The RF input 113 of the RF impedance matching network 111 is coupled to the RF output 116 of the RF generator 115, and similarly, the RF output of the RF impedance matching network 111 is coupled to the RF input of the plasma chamber 120. For simplicity, only one RF generator 113 is shown, although in certain embodiments, more than one RF generator 115 may be included as part of the system 110. An RF sensor 121 is connected between the RF impedance matching network 111 and the RF generator 115 so that the RF signal output from the RF generator 115 may be monitored. Each RF generator 115 included as part of the system 110 should be paired with a suitably configured RF sensor 121, i.e. the RF sensor 121 associated with an RF generator 115 is configured to detect signals at the operational frequency of the RF generator 115. An RF output sensor 149 is connected between the RF impedance matching network 111 and the plasma chamber 119 so that the RF output from the impedance matching network, and the plasma impedance presented by the plasma chamber 119, may be monitored. Certain embodiments may include only one of the RF sensor 121 and the output sensor 149. The functioning of these sensors 121, 149 are described in greater detail below.

The RF impedance matching network 111 serves to help maximize the amount of RF power transferred from the RF generator 115 to the plasma chamber 119 by matching the impedance at the RF input 113 to the fixed impedance of the RF generator 115. The matching network 111 may include a single module within a single housing designed for electrical connection to the RF generator 115 and plasma chamber 119. In other embodiments, the components of the matching network 111 can be located in different housings, some components can be outside of the housing, and/or some components can share a housing with a component outside the matching network.

As is known in the art, the plasma within a plasma chamber 119 typically undergoes certain fluctuations outside of operational control so that the impedance presented by the plasma chamber 119 is a variable impedance. Since the variable impedance of the plasma chamber 119 cannot be fully controlled, an impedance matching network may be used to create an impedance match between the plasma chamber 119 and the RF generator 115. Moreover, the impedance of the RF generator 115 may be fixed at a set value by the design of the particular RF generator 115. Although the fixed impedance of an RF generator 115 may undergo minor fluctuations during use, due to, for example, temperature or other environmental variations, the impedance of the RF generator 115 is still considered a fixed impedance for purposes of impedance matching because the fluctuations do not significantly vary the fixed impedance from the originally set impedance value. Other types of RF generators 115 may be designed so that the impedance of the RF generator 115 may be set at the time of, or during, use. The impedance of such types of RF generators 115 is still considered fixed because it may be controlled by a user (or at least controlled by a programmable controller) and the set value of the impedance may be known at any time during operation, thus making the set value effectively a fixed impedance.

The RF generator 115 may be any type that is known in the art. The RF generator 115 generates an RF signal at an appropriate frequency and power for the process performed within the plasma chamber 119. For certain applications, the power of the RF signal output from the RF generator 115 may be pulsed, and such a pulsed signal would generally be characterized by a pulse rate and a duty cycle. The RF generator 115 may be electrically connected to the RF input 113 of the RF impedance matching network 111 using a coaxial cable, which for impedance matching purposes would have the same fixed impedance as the RF generator 115.

The plasma chamber 119 includes a first electrode 123 and a second electrode 125, and in processes that are well known in the art, the first and second electrodes 123, 125, in conjunction with appropriate control systems (not shown) and the plasma in the plasma chamber, enable one or both of deposition of materials onto a substrate 127 and etching of materials from the substrate 127.

The RF impedance matching network 111 includes a series variable capacitor 131, a shunt variable capacitor 133, and a series inductor 135 configured as one form an 'L' type matching network. In particular, the shunt variable capacitor 133 is shown shunting to ground 140 between the series variable capacitor 131 and the series inductor 135, and one of skill in the art will recognize that the RF impedance matching network 111 may be configured with the shunt variable capacitor 133 shunting to ground 140 at the RF input 113 or at the RF output 117. Alternatively, the RF impedance matching network 111 may be configured in other matching network configurations, such as a 'T' type configuration or a 'Π' type configuration. In certain embodiments, the variable capacitors and the switching circuit described below may be included in any configuration appropriate for an RF impedance matching network.

Each of the series variable capacitor 131 and the shunt variable capacitor 133 may be an electronic variable capacitor (EVC), as described in U.S. Pat. No. 7,251,121. The series variable capacitor 131 is coupled in series between the RF input 113 and the RF output 117 (which is also in parallel between the RF generator 115 and the plasma chamber 119). The shunt variable capacitor 133 is coupled in parallel between the RF input 113 and ground 140. In other configurations, the shunt variable capacitor 133 may be coupled in parallel between the RF output 119 and ground 140. Other configurations may also be implemented without departing from the functionality of an RF matching network.

The series variable capacitor 131 is connected to a series RF choke and filter circuit 137 and to a series driver circuit 139. Similarly, the shunt variable capacitor 133 is connected to a shunt RF choke and filter circuit 141 and to a shunt driver circuit 143. Each of the series and shunt driver circuits 139, 143 are connected to a control circuit 145, which is configured with an appropriate processor and/or signal generating circuitry to provide an input signal for controlling the series and shunt driver circuits 139, 143. A power supply 147 is connected to each of the RF sensor 121, the series driver circuit 139, the shunt driver circuit 143, and the control circuit 145 to provide operational power, at the designed currents and voltages, to each of these components. The voltage levels provided by the power supply 147, and thus the voltage levels employed by each of the RF sensor 121, the series driver circuit 139, the shunt driver circuit 143, and the control circuit 145 to perform the respective designated tasks, is a matter of design choice. In other embodiments, a variety of electronic components can be used to enable the control circuit 145 to send command signals to the variable capacitors. Further, while the driver circuit and RF choke and filter are shown as separate from the control circuit 145, these components can also be considered as forming part of the control circuit 145.

In the exemplified embodiment, the control circuit 145 includes a processor. The processor may be any type of properly programmed processing device, such as a computer or microprocessor, configured for executing computer program instructions (e.g. code). The processor may be embodied in computer and/or server hardware of any suitable type (e.g. desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc. The processor of the exemplified embodiment is configured with specific algorithms to enable matching network to perform the functions described herein.

With the combination of the series variable capacitor 131 and the shunt variable capacitor 133, the combined impedances of the RF impedance matching network 111 and the plasma chamber 119 may be controlled, using the control circuit 145, the series driver circuit 139, the shunt driver circuit 143, to match, or at least to substantially match, the fixed impedance of the RF generator 115.

The control circuit 145 is the brains of the RF impedance matching network 111, as it receives multiple inputs, from sources such as the RF sensor 121 and the series and shunt variable capacitors 131, 133, makes the calculations necessary to determine changes to the series and shunt variable capacitors 131, 133, and delivers commands to the series and shunt variable capacitors 131, 133 to create the impedance match. The control circuit 145 is of the type of control circuit that is commonly used in semiconductor fabrication processes, and therefore known to those of skill in the art. Any differences in the control circuit 145, as compared to control circuits of the prior art, arise in programming differences to account for the speeds at which the RF impedance matching network 111 is able to perform switching of the variable capacitors 131, 133 and impedance matching.

Each of the series and shunt RF choke and filter circuits 137, 141 are configured so that DC signals may pass between the series and shunt driver circuits 139, 143 and the respective series and shunt variable capacitors 131, 133, while at the same time the RF signal from the RF generator 115 is blocked to prevent the RF signal from leaking into the outputs of the series and shunt driver circuits 139, 143 and the output of the control circuit 145. The series and shunt RF choke and filter circuits 137, 141 are of a type known to those of skill in the art.

During operation, the RF sensor 121 is configured to detect signals reflected back to the RF generator 115 from the plasma chamber 119 at the RF input 113. The detected signals are processed by a multi-stage heterodyne, the output of which is detected as described above to generate a DC signal. The control circuit 145 receives the DC signal and may adjust the power output of the RF generator 115 in response to the DC signal. The RF sensor 121 may also be configured to the RF sensor 121 configured to detect an RF input parameter at the RF input 113, from which the control circuit 145 determines the input impedance and adjusts one or both of the series and shunt capacitors in response thereto.

While the invention has been described with respect to specific examples including presently preferred modes of carrying out the invention, those skilled in the art will appreciate that there are numerous variations and permutations of the above described systems and techniques. It is to be understood that other embodiments may be utilized and structural and functional modifications may be made without departing from the scope of the present invention. Thus, the spirit and scope of the invention should be construed broadly as set forth in the appended claims.

What is claimed is:

1. A circuit for controlling an RF generator, the circuit comprising:
 a first heterodyne stage receiving an input signal, the input signal being based on a characteristic of an RF signal generated by the RF generator, with the first heterodyne stage configured to:
  mix the input signal with a first mix signal to generate a first heterodyne signal; and
  filter the first heterodyne signal through a low pass filter;
 a second heterodyne stage receiving the filtered first heterodyne signal, the second heterodyne stage configured to:
  mix the filtered first heterodyne signal with a second mix signal to generate a second heterodyne signal; and
  filter the second heterodyne signal through a band pass filter;
 a detection stage configured to convert the filtered second heterodyne signal to a DC signal; and
 a power control stage receiving the DC signal and configured to control the RF signal in response to the DC signal.

2. The circuit of claim 1, wherein the RF signal is a pulsed RF signal.

3. The circuit of claim 1, wherein the characteristic is a voltage of the RF signal.

4. The circuit of claim 1, wherein the characteristic is a current of the RF signal.

5. The circuit of claim 1, wherein the frequency of the RF signal output from the RF generator is variable.

6. The circuit of claim 1, wherein the first heterodyne stage down-converts the input signal.

7. The circuit of claim 6, wherein the second heterodyne stage up-converts the filtered first heterodyne signal.

8. The circuit of claim 1, wherein the first heterodyne stage down-converts the input signal by at least an order of magnitude, and the second heterodyne stage up-converts the filtered first heterodyne signal by at least an order of magnitude.

9. A method for controlling an RF generator, the method comprising:
 sensing a characteristic of an RF signal output from the RF generator and outputting a sensor signal in response to the sensed characteristic;
 mixing the sensor signal with a first mix signal to generate a first heterodyne signal;
 filtering the first heterodyne signal through a low pass filter;
 mixing the filtered first heterodyne signal with a second mix signal to generate a second heterodyne signal;
 filtering the second heterodyne signal through a band pass filter;
 detecting the filtered second heterodyne signal to generate a DC signal; and
 controlling the RF signal in response to the DC signal.

10. The method of claim 9, wherein the RF signal is a pulsed RF signal.

11. The method of claim 9, wherein the characteristic is a voltage of the RF signal.

12. The method of claim 9, wherein the characteristic is a current of the RF signal.

13. The method of claim 9, wherein the frequency of the RF signal output from the RF generator is variable.

14. The method of claim 9, wherein mixing the sensor signal includes down-converting the sensor signal.

15. The method of claim 14, wherein mixing the filtered first heterodyne signal includes up-converting the filtered first heterodyne signal.

16. The method of claim 9, wherein:
 mixing the sensor signal includes down-converting the sensor signal by at least one order of magnitude; and
 mixing the filtered first heterodyne signal includes up-converting the filtered first heterodyne signal by at least one order of magnitude.

17. An RF generator comprising:
 an RF generator configured to generate an RF signal;
 a signal sensor configured to sense a characteristic of the RF signal and output a sensor signal in response thereto; and
 a control circuit operationally coupled to the RF generator, the control circuit comprising:
  a first heterodyne stage receiving the sensor signal, with the first heterodyne stage configured to:
   mix the sensor signal with a first mix signal to generate a first heterodyne signal; and
   filter the first heterodyne signal through a low pass filter;
  a second heterodyne stage receiving the filtered first heterodyne signal, the second heterodyne stage configured to:
   mix the filtered first heterodyne signal with a second mix signal to generate a second heterodyne signal; and
   filter the second heterodyne signal through a band pass filter; and
  a detection stage configured to convert the filtered second heterodyne signal to a DC signal;
 wherein the control circuit is configured to control the RF signal in response to the DC signal.

18. The RF generator of claim 17, wherein the RF signal is a pulsed RF signal.

19. The RF generator of claim 17, wherein the characteristic is a voltage of the RF signal.

20. The RF generator of claim 17, wherein the characteristic is a current of the RF signal.

21. The RF generator of claim 17, wherein the frequency of the RF signal output from the RF generator is variable.

22. The RF generator of claim 17, wherein the first heterodyne stage down-converts the sensor signal.

23. The RF generator of claim 22, wherein the second heterodyne stage up-converts the filtered first heterodyne signal.

24. The RF generator of claim 17, wherein the first heterodyne stage down-converts the sensor signal by at least an order of magnitude, and the second heterodyne stage up-converts the filtered first heterodyne signal by at least an order of magnitude.

25. A semiconductor fabrication system comprising:
 an RF generator configured to generate an RF signal;
 a plasma chamber operationally coupled to the RF generator to receive the RF signal;
 a signal sensor operationally coupled between the RF generator and the plasma chamber, the signal sensor configured to sense a characteristic of the RF signal and output a sensor signal in response thereto; and a control circuit operationally coupled to the RF generator and to the signal sensor, the control circuit comprising:

a first heterodyne stage receiving the sensor signal, with the first heterodyne stage configured to:

mix the sensor signal with a first mix signal to generate a first heterodyne signal; and filter the first heterodyne signal through a low pass filter;

a second heterodyne stage receiving the filtered first heterodyne signal, the second heterodyne stage configured to:

mix the filtered first heterodyne signal with a second mix signal to generate a second heterodyne signal; and filter the second heterodyne signal through a band pass filter; and a detection stage configured to convert the filtered second heterodyne signal to a DC signal;

wherein the control circuit is configured to control the RF signal in response to the DC signal.

26. The system of claim 25, wherein the RF signal is a pulsed RF signal.

27. The system of claim 25, wherein the characteristic is a voltage of the RF signal.

28. The system of claim 25, wherein the characteristic is a current of the RF signal.

29. The system of claim 25, wherein the frequency of the RF signal output from the RF generator is variable.

30. The system of claim 25, wherein the first heterodyne stage down-converts the sensor signal.

31. The system of claim 30, wherein the second heterodyne stage up-converts the filtered first heterodyne signal.

32. The system of claim 25, wherein the first heterodyne stage down-converts the sensor signal by at least an order of magnitude, and the second heterodyne stage up-converts the filtered first heterodyne signal by at least an order of magnitude.

33. A control circuit comprising:

a first heterodyne stage receiving an input signal, the input signal being based on a characteristic of a pulsed RF signal, with the first heterodyne stage configured to:

mix the input signal with a first mix signal to generate a first heterodyne signal; and filter the first heterodyne signal through a low pass filter;

a second heterodyne stage receiving the filtered first heterodyne signal, the second heterodyne stage configured to:

mix the filtered first heterodyne signal with a second mix signal to generate a second heterodyne signal; and filter the second heterodyne signal through a band pass filter;

a detection stage configured to convert the filtered second heterodyne signal to a DC signal; and a power control stage receiving the DC signal and configured to control the pulsed RF signal in response to the DC signal.

34. The circuit of claim 33, wherein the characteristic is a voltage of the pulsed RF signal.

35. The circuit of claim 33, wherein the characteristic is a current of the pulsed RF signal.

36. The circuit of claim 33, wherein the first heterodyne stage down-converts the input signal.

37. The circuit of claim 36, wherein the second heterodyne stage up-converts the filtered first heterodyne signal.

38. The circuit of claim 33, wherein the first heterodyne stage down-converts the input signal by at least an order of magnitude, and the second heterodyne stage up-converts the filtered first heterodyne signal by at least an order of magnitude.

* * * * *